United States Patent
Chuang et al.

(10) Patent No.: US 11,726,747 B2
(45) Date of Patent: *Aug. 15, 2023

(54) MAGNETORESISTIVE RANDOM-ACCESS MEMORY (MRAM) RANDOM NUMBER GENERATOR (RNG) AND A RELATED METHOD FOR GENERATING A RANDOM BIT

(71) Applicant: Taiwan Semiconductor Manufacturing Company, Ltd., Hsin-Chu (TW)

(72) Inventors: Harry-Hak-Lay Chuang, Zhubei (TW); Chih-Yang Chang, Hsinchu (TW); Ching-Huang Wang, Pingjhen (TW); Chih-Hui Weng, Tainan (TW); Tien-Wei Chiang, Taipei (TW); Meng-Chun Shih, Hsinchu (TW); Chia Yu Wang, Hsinchu County (TW); Chia-Hsiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/078,482

(22) Filed: Dec. 9, 2022

(65) Prior Publication Data

US 2023/0115281 A1    Apr. 13, 2023

Related U.S. Application Data

(63) Continuation of application No. 16/434,345, filed on Jun. 7, 2019, now Pat. No. 11,531,524.

(60) Provisional application No. 62/735,292, filed on Sep. 24, 2018.

(51) Int. Cl.
*G06F 7/58* (2006.01)
*G11C 11/16* (2006.01)

(52) U.S. Cl.
CPC .......... *G06F 7/588* (2013.01); *G11C 11/1673* (2013.01); *G11C 11/1675* (2013.01)

(58) Field of Classification Search
CPC . G06F 7/58; G06F 7/588; G11C 11/16–1693; H04L 9/00; H04L 9/001
USPC .................................................. 708/250, 255
See application file for complete search history.

(56) References Cited

U.S. PATENT DOCUMENTS 9,600,237 B2    3/2017  Katoh
2018/0102155 A1    4/2018  Tang et al.
2019/0347074 A1    11/2019  Choi

OTHER PUBLICATIONS

Non-Final Office Action dated Feb. 23, 2022 for U.S. Appl. No. 16/434,345.

(Continued)

*Primary Examiner* — Emily E Larocque
(74) *Attorney, Agent, or Firm* — Eschweiler & Potashnik, LLC

(57) ABSTRACT

In some embodiments, a method for generating a random bit is provided. The method includes generating a first random bit by providing a random number generator (RNG) signal to a magnetoresistive random-access memory (MRAM) cell. The RNG signal has a probability of about 0.5 to switch the resistive state of the MRAM cell from a first resistive state corresponding to a first data state to a second resistive state corresponding to a second data sate. The first random bit is then read from the MRAM cell.

20 Claims, 6 Drawing Sheets

(56) References Cited

OTHER PUBLICATIONS

Final Office Action dated Jun. 22, 2022 for U.S. Appl. No. 16/434,345.
Notice of Allowance dated Sep. 15, 2022 for U.S. Appl. No. 16/434,345.
W. H. Choi et al., A Magnetic Tunnel Junction Based True Random Number Generator with Conditional Perturb and Real-Time Output Probability Tracking, IEEE 2014 (Year: 2014).
Y. Qu et al., A True Random Number Generator base on Parallel STT-MTJs, IEEE 2017 (Year: 2017).

M=1

|  | | 503a ↓ | 503b ↓ | 503c ↓ | 503d ↓ |
|---|---|---|---|---|---|
| MRAM Cell # | | 1 | 2 | 3 | 4 |
| Signal | Value | | | | |
| $S_{W2}$ | 1.1 V | 1 | 0 | 0 | 0 |
| $S_{W3}$ | 1.2 V | 1 | 1 | 0 | 0 |
| $S_{W4}$ | 1.3 V | 1 | 1 | 1 | 1 |
| $S_{W5}$ | 1.4 V | 1 | 1 | 1 | 1 |

⋮

M=9

| MRAM Cell # | | 1 | 2 | 3 | 4 |
|---|---|---|---|---|---|
| Signal | Value | | | | |
| $S_{W2}$ | 1.1 V | 0 | 1 | 0 | 0 |
| $S_{W3}$ | 1.2 V | 1 | 1 | 0 | 0 |
| $S_{W4}$ | 1.3 V | 1 | 1 | 1 | 0 |
| $S_{W5}$ | 1.4 V | 1 | 1 | 1 | 0 |

Fig. 5B

|  | | 503a ↓ | 503b ↓ | 503c ↓ | 503d ↓ |
|---|---|---|---|---|---|
| MRAM Cell # | | 1 | 2 | 3 | 4 |
| Signal | Value | | | | |
| $S_{W2}$ | 1.1 V | 4 | 2 | 3 | 4 |
| $S_{W3}$ | 1.2 V | [5] | 3 | 4 | [5] |
| $S_{W4}$ | 1.3 V | 6 | 4 | [5] | 6 |
| $S_{W5}$ | 1.4 V | 7 | [5] | 6 | 7 |

Fig. 5C

MAGNETORESISTIVE RANDOM-ACCESS MEMORY (MRAM) RANDOM NUMBER GENERATOR (RNG) AND A RELATED METHOD FOR GENERATING A RANDOM BIT

REFERENCE TO RELATED APPLICATIONS

This Application is a Continuation of U.S. application Ser. No. 16/434,345, filed on Jun. 7, 2019, which claims the benefit of U.S. Provisional Application No. 62/735,292, filed on Sep. 24, 2018. The contents of the above-referenced Patent Applications are hereby incorporated by reference in their entirety.

BACKGROUND

Many modern day electronic devices (e.g., computers, mobile phones, etc.) rely on random numbers to securely store and transmit data. These random numbers may be generated by a random number generator (RNG). Some types of random number generators are pseudorandom number generators (PRNGs), while others are true random number generators (TRNGs). PRNGs rely on algorithms (e.g., software) to generate a PRNG-sequence that resembles a sequence of random numbers. However, the PRNG-sequence is not a truly random number due to the PRNG-sequence being determined by a non-random initial value (e.g., a seed value). On the other hand, TRNGs rely on physical processes that, in theory, are truly random. Thus, TRNGs are favored over PRNGs in some digital applications (e.g., cryptography).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C illustrate some more detailed embodiments of the probability trimming series of FIGS. 4A-4B being performed on a plurality of magnetoresistive random-access memory (MRAM) cells.

DETAILED DESCRIPTION

Figure 1:
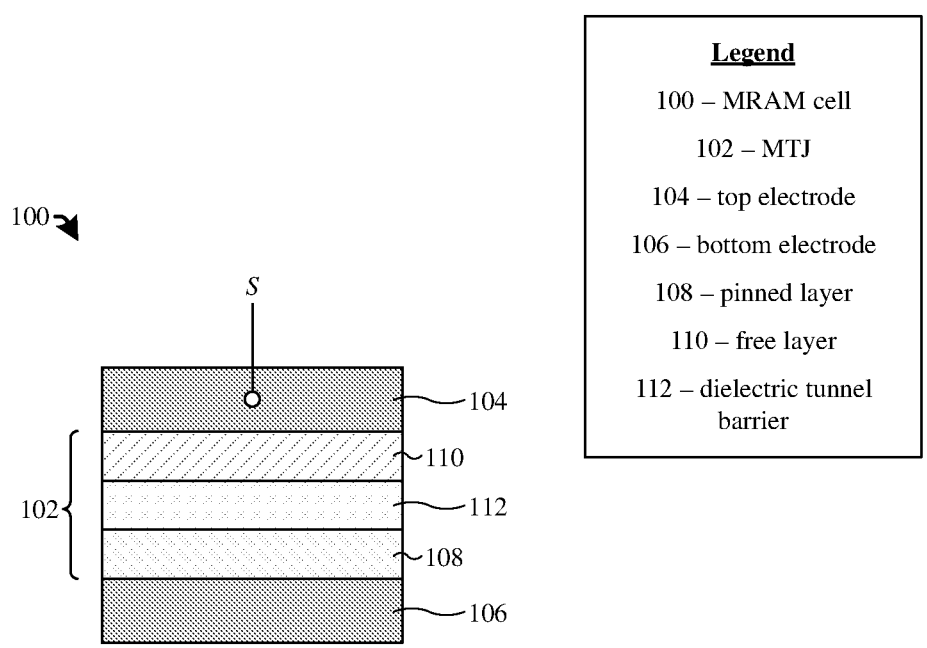
FIG. 1 illustrates a cross-sectional view of some embodiments of a magnetoresistive random-access memory (MRAM) cell configured to generate a random bit.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, integrated chips (ICs) comprise electronic memory devices. Magnetoresistive random-access memory (MRAM) memory devices are candidates for next generation electronic memory devices due to their fast read/write speeds, low power consumption, and compatibility with current complementary metal-oxide-semiconductor (CMOS) processes. MRAM memory devices (e.g., random-access memory (RAM), read-only memory (ROM), hardware caches, solid-state disks (SSDs), etc.) typically comprise a plurality of MRAM cells arranged in an array.

The MRAM cells comprise a magnetic tunnel junction (MTJ) configured to store data based on a magnetic orientation of the MTJ. For example, the MTJ may have a first resistive state (e.g., a parallel orientation between a pinned layer and a free layer) associated with a first data state (e.g., binary "0") or a second resistive state (e.g., an anti-parallel orientation between a pinned layer and a free layer) associated with a second data state (e.g., binary "1"). The resistive state of the MRAM cells may be switched by providing the MRAM cells an electrical signal having a specific value (e.g., voltage value, current value, etc.) corresponding to one or more pulses. To reduce the potential of read/write errors, the specific value corresponding to the one or more pulses is such that when the electrical signal is provided to the MRAM cells the MRAM cells have a probability of about 1 (e.g., about 100 percent) to switch resistive states.

In various embodiments, the present application is directed toward a method for generating a random bit with a MRAM cell. The random bit is generated by first setting a resistive state of the MRAM cell to a first resistive state. A RNG signal is then provided to the MRAM cell, where the RNG signal has a probability of about 0.5 (e.g., about 50 percent) to switch the resistive state of the MRAM cell from the first resistive state to a second resistive state. Because the RNG signal has a probability of about 0.5 to switch the resistive state of the MRAM cell from the first resistive state to the second resistive state, the resultant data state stored in the MRAM cell is a random bit. Further, because the MRAM cell switching its resistive state is a physical process (e.g., physically switching the orientation of its free layer) and the RNG signal has a probability of about 0.5 to switch the resistive state of the MRAM cell from the first resistive state to the second resistive state, multiple MRAM cells may be utilized in a random number generator (RNG) (e.g., a true random number generator). Moreover, the RNG may be integrated into an IC having a MRAM memory device without increasing manufacturing complexities (e.g., increased deposition processes, photolithography processes, etching processes, etc.), and thus the cost to integrate the RNG on the IC may be reduced.

In some embodiments, the RNG signal is generated by performing a probability trimming series on the MRAM cell. The probability trimming series comprises performing a probability trimming loop a predefined number of times. The probability trimming loop comprises providing a plurality of write signals to the MRAM cell. Each of the plurality of write signals has a corresponding value (e.g., voltage value, pulse width, number of pulses, magnetic field strength, etc.). The corresponding values of the write signals may differ from one another in a stepwise like manner (e.g., incremental increases/decreases in voltage, pulse width, number of pulses, magnetic field strength, etc.). Before each write signal is provided to the MRAM cell, the MRAM cell is set to the first resistive state. After each write signal is provided to the MRAM cell, the resistive state of the MRAM cell is read and recorded to document whether the resistive state of the MRAM cell switched from the first resistive state to a second resistive state.

Across a total number of times the probability trimming loop is performed, a total number of times the resistive state of the MRAM cell switched from the first resistive state to the second resistive state is calculated for each of the write signals. Thereafter, a calculation may be performed to determine which value of the corresponding values has a probability of about 0.5 to switch the resistive state of the MRAM cell from the first resistive state to the second resistive state. The RNG signal is then generated based on the value that has the probability of about 0.5 to switch the resistive state of the MRAM cell from the first resistive state to the second resistive state. Accordingly, the RNG signal has a probability of about 0.5 to switch the resistive state of the MRAM cell from the first resistive state to a second resistive state.

FIG. 1 illustrates a cross-sectional view of some embodiments of a magnetoresistive random-access memory (MRAM) cell 100 configured to generate a random bit.

As shown in FIG. 1, the MRAM cell 100 comprises a magnetic tunnel junction (MTJ) 102 disposed between a top electrode 104 and a bottom electrode 106. In some embodiments, the MTJ 102 comprises a pinned layer 108 separated from a free layer 110 by a dielectric tunnel barrier 112. In some embodiments, the pinned layer 108 may comprise cobalt (Co), iron (Fe), boron (B), nickel (Ni), ruthenium (Ru), iridium (Ir), platinum (Pt), or the like. In some embodiments, the dielectric tunnel barrier 112 may comprise magnesium oxide (MgO), aluminum oxide ($Al_2O_3$), or the like. In some embodiments, the free layer 110 may comprise cobalt (Co), iron (Fe), boron (B), or the like.

The pinned layer 108 has a magnetic moment having a fixed orientation, while the free layer 110 has a magnetic moment in which its orientation can be changed to be either parallel (e.g., a 'P' state) or anti-parallel (e.g., an 'AP' state) with respect to the orientation of the magnetic moment of the pinned layer 108. A relationship between the magnetic moment orientation of the pinned layer 108 and the free layer 110 defines a resistive state of the MRAM cell 100, and thereby enables the MRAM cell 100 to store a data state. For example, in some embodiments, the MRAM cell 100 has a first resistive state (e.g., a low resistance state) when the orientation of the magnetic moment of the pinned layer 108 and the free layer 110 are parallel, and the MRAM cell 100 has a second resistive state (e.g., a high resistance state) when the orientation of the magnetic moment of the pinned layer 108 and the free layer 110 are anti-parallel. Accordingly, the MRAM cell 100 may store either a first data state (e.g., a binary "0") when the MRAM cell 100 has the first resistive state or a second data state (e.g., a binary "1") when the MRAM cell 100 has the second resistive state.

To switch the resistive state of the MRAM cell 100 between the first resistive state and the second resistive state, resistive state switching electrical signals are provided to the MRAM cell 100, respectively. The resistive state switching electrical signals comprise switching values corresponding to one or more pulses of the resistive state switching electrical signals, respectively. For example, to change the resistive state of the MRAM cell from the first resistive state to the second resistive state, a first resistive state switching electrical signal is provided to the MRAM cell 100. The first resistive state switching electrical signal comprises a first switching value corresponding to one or more pulses that when provided to the MRAM cell 100 switches the resistive state of the MRAM cell 100 from the first resistive state to the second resistive state.

Further, switching the resistive state of the MRAM cell 100 between the first resistive state and the second resistive state is based on a probability of the resistive state of the MRAM cell 100 switching when the resistive state switching electrical signals are respectively provided to the MRAM cell 100. For example, if the first switching value corresponding to the one or more pulses is 0.1 Volt (V), the probability that the resistive state of the MRAM cell 100 switches from the first resistive state to the second resistive state may be about 0.1 (e.g., 10 percent). On the other hand, if the first switching value corresponding to the one or more pulses is 5 Volt (V), the probability that the resistive state of the MRAM cell 100 switches from the first resistive state to the second resistive state may be about 1 (e.g., 100 percent). Typically, the MRAM cell 100 is utilized in a MRAM memory device (e.g., random-access memory (RAM), read-only memory (ROM), hardware caches, solid-state disks (SSDs), etc.). Accordingly, to reduce the number of read/write errors of the MRAM memory device, the first switching value corresponding to the one or more pulses may be such that the probability that the resistive state of the MRAM cell 100 switches from the first resistive state to the second resistive state is about 1 (e.g., 100 percent).

Also shown in FIG. 1, a random number generator (RNG) signal S is provided to the MRAM cell 100. The RNG signal can, for example, take the form of one or more current or voltage pulses applied across the top electrode 104 and bottom electrode 106, or can take the form of one or more magnetic field pulses applied to the MRAM cell 100. The RNG signal S comprises a RNG value that corresponds to one or more pulses and that has a probability of about 0.5 to switch the state of the MRAM cell from the first state to the second state. In some embodiments, the RNG value corresponding to the one or more pulses is a voltage value. In such an embodiment, the RNG value may be between about 1 V and 2.5 V. In some embodiments, the RNG value corresponding to the one or more pulses is a duration value of pulse width. Pulse width is the transient time in which the RNG signal S has a predefined amplitude different than a baseline amplitude. In such embodiments, the RNG value may be between about 10 nanoseconds and about 1 microsecond. In further such embodiments, the predefined amplitude and the baseline amplitude may be a measure of, for example, voltage, current, or the like.

In some embodiments, the RNG value corresponding to the one or more pulses is a number of pulse signals (e.g., write attempts) over a predefined time. In such embodiments, each of the pulse signals may have a same amplitude and a same pulse width. In further such embodiments, the amplitude may be a measure of, for example, voltage, current, or the like. In yet further such embodiments, the RNG value may be between about 1 pulse signal and about 50 pulse signals. In some embodiments, the RNG value corresponding to the one or more pulses is current value. In such embodiments, the RNG value may be between a first current value that is sufficient to induce a magnetic field that passes through the MRAM cell 100 with a magnetic field strength of about 100 oersted (Oe), and a second current value that is sufficient to induce a magnetic field that passes through the MRAM cell 100 with a magnetic field strength of about 4000 Oe. In further such embodiments, the RNG signal S may be provided to a conductive line (e.g., a bit line, word line, write line, etc.) that is disposed near the MRAM cell 100.

Further, the RNG signal S has a probability of about 0.5 (e.g., about 50 percent) to switch the resistive state of the MRAM cell 100 from the first resistive state to the second resistive state, or vice versa. In some embodiments, the probability of about 0.5 comprises any probability within 10 percent (e.g., between 0.45 and 0.55) of the probability of 0.5. More specifically, the probability of about 0.5 comprises any probability within 8 percent (e.g., between 0.46 and 0.54) of the probability of 0.5, any probability within 6 percent (e.g., between 0.47 and 0.53) of the probability of 0.5, any probability within 4 percent (e.g., between 0.48 and 0.52) of the probability of 0.5, and/or any probability within 2 percent (e.g., between 0.49 and 0.51) of the probability of 0.5. In further embodiments, the RNG signal S has a probability of about 0.5 to switch the resistive state of the MRAM cell 100 due to the RNG value corresponding to the one or more pulses causing the RNG signal S to switch from the first resistive state to the second resistive state, or vice versa, about half the time the RNG signal S is provided to the MRAM cell 100. Because the RNG signal S has a probability of about 0.5 to switch the resistive state of the MRAM cell 100 from the first resistive state to the second resistive state, or vice versa, the MRAM cell 100 may generate a random bit (e.g., either the first data state or the second data state).

Moreover, because the MRAM cell 100 switches its resistive state based on a physical process (e.g., physically switching the magnetic moment orientation of its free layer) and the RNG signal S has a probability of about 0.5 to switch the resistive state of the MRAM cell 100 from the first resistive state to the second resistive state, or vice versa, multiple MRAM cells 100 may be utilized in a random number generator (RNG) (e.g., a true random number generator). Further, the RNG may be integrated into an integrated chip (IC) having a MRAM memory device without increasing manufacturing complexities (e.g., increased deposition processes, photolithography processes, etching processes, etc.). Accordingly, the cost to integrate the RNG on the IC may be reduced.

Figure 2:
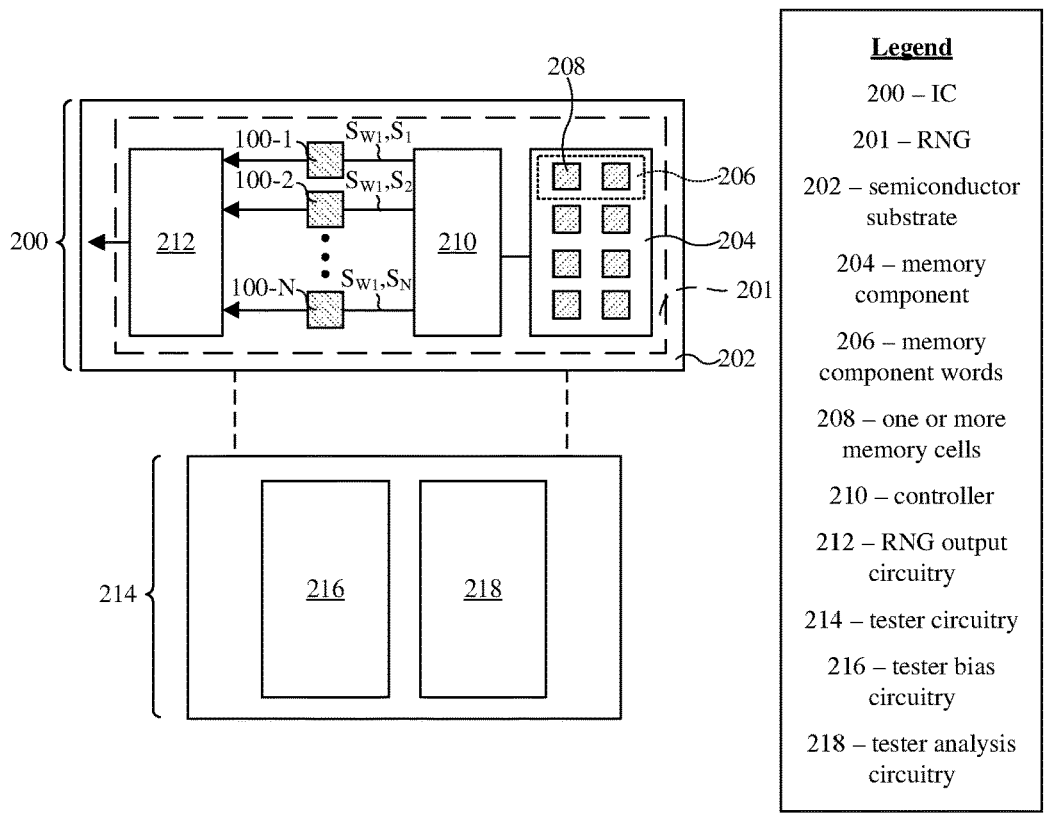
FIG. 2 illustrates a layout view of some embodiments of an integrated chip (IC) having a random number generator (RNG) comprising a plurality of MRAM cells each represented by the MRAM cell of FIG. 1.

FIG. 2 illustrates a layout view of some embodiments of an integrated chip (IC) 200 having a random number generator (RNG) 201 comprising a plurality of MRAM cells, each corresponding to the MRAM cell 100 of FIG. 1.

As shown in FIG. 2, the IC 200 comprises a RNG 201 disposed on a semiconductor substrate 202. The RNG 201 comprises a plurality of MRAM cells, and the plurality of MRAM cells comprises N MRAM cells (100-1-100-N), where N is a number greater than or equal to 1. In some embodiments, the N MRAM cells (100-1-100-N) may be, for example, field write MRAM cells, STT-MRAM cells, or the like. In some embodiments, the semiconductor substrate 202 comprises any type of semiconductor body (e.g., monocrystalline silicon/CMOS bulk, silicon-germanium (SiGe), silicon on insulator (SOI), etc.).

Further, the RNG 201 comprises a memory component 204 configured to store data units (e.g., 1-bit data units, 2-bits data units, 4-bits data units, 8-bits data units, 16-bits data units, etc.) for the N MRAM cells (100-1-100-N), respectively. The data units store the RNG value corresponding to the one or more pulses for the N MRAM cells (100-1-100-N), respectively. The memory component 204 stores the data units in memory component words 206, respectively. Each of the memory component words 206 comprises one or more memory cells 208 depending on the number of bits needed to store the data units. In some embodiments, the memory cells 208 may be, for example, memory component MRAM cells, memory component fuses, memory component resistive random-access cells, memory component flash memory cells, etc. In further embodiments, the memory component 204 may be, for example, read-only memory (ROM), a solid-state disk (SSDs), a register, a hardware cache, random-access memory, or the like.

A controller 210 is coupled to the memory component 204 and each of the N MRAM cells (100-1-100-N). Initially, the controller 210 is configured to set the resistive states of the N MRAM cells (100-1-100-N) to the first resistive state, respectively, by providing a first write signal $S_{W1}$ to each of the N MRAM cells (100-1-100-N). Further, the controller 210 is configured to read the data units stored in the memory component 204. Subsequently, the controller 210 is configured to provide random number generator (RNG) signals $S_1$-$S_N$ to the N MRAM cells (100-1-100-N), respectively. Each of the RNG signals $S_1$-$S_N$ comprises the RNG value corresponding to the one or more pulses for its corresponding one of the N MRAM cell (100-1-100-N).

For example, one of the memory component words 206 may store a first data unit and another one of the memory component words 206 may store a second data unit. The first data unit may store a first RNG value corresponding to the one or more pulses that corresponds to one of the N MRAM cells (e.g., 100-1), and the second data unit may store a second RNG value corresponding to the one or more pulses that correspond to another one of the N MRAM cells (e.g., 100-2). The controller 210 may set the resistive state of the one of the N MRAM cells (e.g., 100-1) and the other one of the N MRAM cells (e.g., 100-2) to the first resistive state by providing each of them the first write signal $S_{W1}$. The controller 210 reads the one of the memory component words 206 and the other one of the memory component words 206. After the controller 210 reads the one of the memory component words 206 and the other one of the memory component words 206, the controller 210 generates a first RNG signal (e.g., $S_1$) comprising the first RNG value corresponding to the one or more pulses and a second RNG signal (e.g., $S_2$) comprising the second RNG value corresponding to the one or more pulses. The controller 210 then provides the first RNG signal (e.g., $S_1$) to the one of the N MRAM cells (e.g., 100-1) and the second RNG signal (e.g., $S_2$) to the other one of the N MRAM cells (e.g., 100-2).

RNG output circuitry 212 is coupled to the N MRAM cells (100-1-100-N). The RNG output circuitry 212 is configured to read the resistive states of the N MRAM cells (100-1-100-N), respectively, after the controller 210 provides the RNG signals $S_1$-$S_N$ to the N MRAM cells (100-1-100-N), respectively. Further, the RNG output circuitry 212 is configured to output an N-bit random number based on the resistive states of the N MRAM cells (100-1-100-N) read by the RNG output circuitry 212. The RNG output circuitry 212 outputs the N-bit random number due to each of the N MRAM cells (100-1-100-N) being provided an RNG signal $S_1$-$S_N$ comprising the RNG value corresponding to the one or more pulses for a corresponding one of the N MRAM cell (100-1-100-N).

If the N MRAM cells (100-1-100-N) were completely identical to one another, the RNG signals $S_1$-$S_N$ would have identical pulse shapes as one another to provide a switching probability of about 0.5 for each of the N MRAM cells (100-1-100-N). However, because of small, uncontrollable manufacturing variations in the N MRAM cells (100-1-100-N) and/or other small structural differences in the N MRAM cells (100-1-100-N), the RNG signals $S_1$-$S_N$ often have slightly different pulse shapes from one another to provide a probability of about 0.5 of switching the N MRAM cells (100-1-100-N) from the first resistive state to the second resistive state. Further, in some embodiments, the RNG signals $S_1$-$S_N$ may be applied concurrently to the N MRAM cells (100-1-100-N); such that the N-bits of the N-bit random number can be read simultaneously as a single word.

For example, after the controller 210 provides the one of the N MRAM cells (e.g., 100-1) the first RNG signal (e.g., $S_1$) and the other one of the N MRAM cells (e.g., 100-2) the second RNG signal (e.g., $S_2$), the RNG output circuitry 212 reads the resistive state of the one of the N MRAM cells (e.g., 100-1) and the other one of the N MRAM cells (e.g., 100-2). The probability that the RNG output circuitry 212 reads the resistive state of the one of the MRAM cells (e.g., 100-1) as the second resistive state is about 0.5 (e.g., about 50 percent) due to the controller 210 providing the first RNG signal (e.g., $S_1$), which comprises the first RNG value corresponding to the one or more pulses, to the one of the MRAM cells (e.g., 100-1). Further, the probability that the RNG output circuitry 212 reads the resistive state of the other one of the MRAM cells (e.g., 100-2) as the second resistive state is about 0.5 due to the controller 210 providing the second RNG signal (e.g., $S_2$), which comprises the second RNG value corresponding to the one or more pulses, to the other one of the N MRAM cells (e.g., 100-2). Accordingly, the RNG output circuitry 212 may output a N-bit random number based on the RNG output circuitry 212 having a probability of about 0.5 of reading the resistive state of the one of the MRAM cells (e.g., 100-1) as the second resistive state and a probability of about 0.5 of reading the resistive state of the other one of the MRAM cells (e.g., 100-2) as the second resistive state.

Also shown in FIG. 2, tester circuitry 214 is electrically coupled to the RNG 201. The tester circuitry 214 is configured to provide electrical signals to the RNG 201 and receive electrical signals from the RNG 201. In some embodiments, the tester circuitry 214 may comprise tester bias circuitry 216 and tester analysis circuitry 218. In further embodiments, the tester bias circuitry 216 and the tester analysis circuitry 218 may be electrically coupled together and configured to provide electrical signals to one another.

In some embodiments, the tester bias circuitry 216 is configured to provide the first write signal to the N MRAM cells (100-1-100-N) to set the resistive states of the N MRAM cells (100-1-100-N) to the first resistive state, respectively. In some embodiments, the tester bias circuitry 216 is configured to provide write signals, which are discussed in more detail below (e.g., see, FIGS. 4A-4B), to the RNG 201. In further embodiments, the tester analysis circuitry 218 is configured to record and analyze the resistive states of the N MRAM cells (100-1-100-N) read by the RNG output circuitry 212. In yet further embodiments, the tester bias circuitry 216 is configured to write the data units for the N MRAM cells (100-1-100-N) to the memory component 204.

In some embodiments, the IC 200 comprises the tester circuitry 214. In such embodiments, the tester circuitry 214 is disposed on the semiconductor substrate 202. In other embodiments, a semiconductor wafer testing unit (not shown) comprises the tester circuitry 214. In such embodiments, the tester circuitry 214 may be disposed in a wafer prober housing (not shown) and electrically coupled to the RNG 201 via a probing structure (not shown) (e.g., probe card).

Figure 3:
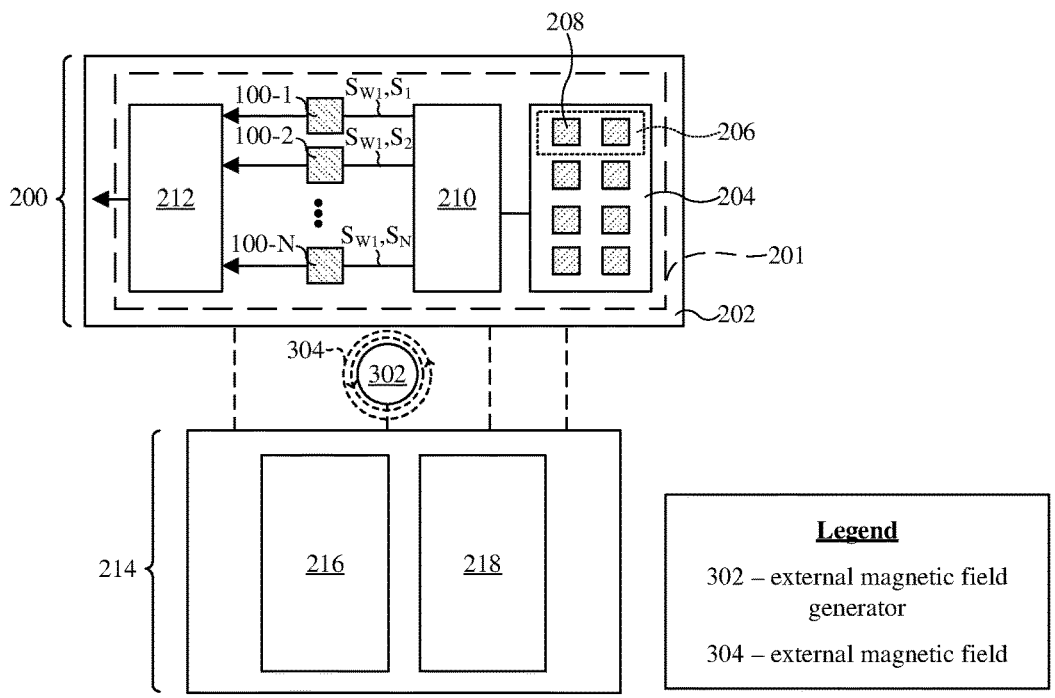
FIG. 3 illustrates a layout view of some more embodiments of the IC of FIG. 2.

FIG. 3 illustrates a layout view of some more embodiments of the IC 200 of FIG. 2.

As shown in FIG. 3, an external magnetic field generator 302 is coupled to the tester circuitry 214. The external magnetic field generator 302 is configured to generate an external magnetic field 304 that passes through the N MRAM cells (100-1-100-N). In some embodiments, the tester circuitry 214 provides the external magnetic field generator 302 a magnetic field generator signal to generate the external magnetic field 304. In further embodiments, the tester circuitry 214 may vary the current of the magnetic field generator signal to vary the magnetic field strength of the external magnetic field 304. In yet further embodiments, by passing the external magnetic field 304 through the MRAM cells (100-1-100-N) and varying the magnetic field strength, the tester circuitry 214 may determine a magnetic field strength for each of the N MRAM cells (100-1-100-N) that has a probability of about 0.5 to switch their respective resistive states from the first resistive state to the second resistive state. These magnetic field strength values may be stored, and then re-applied to the N MRAM cells (100-1-100-N) after testing to generate random numbers.

Figure 4A:
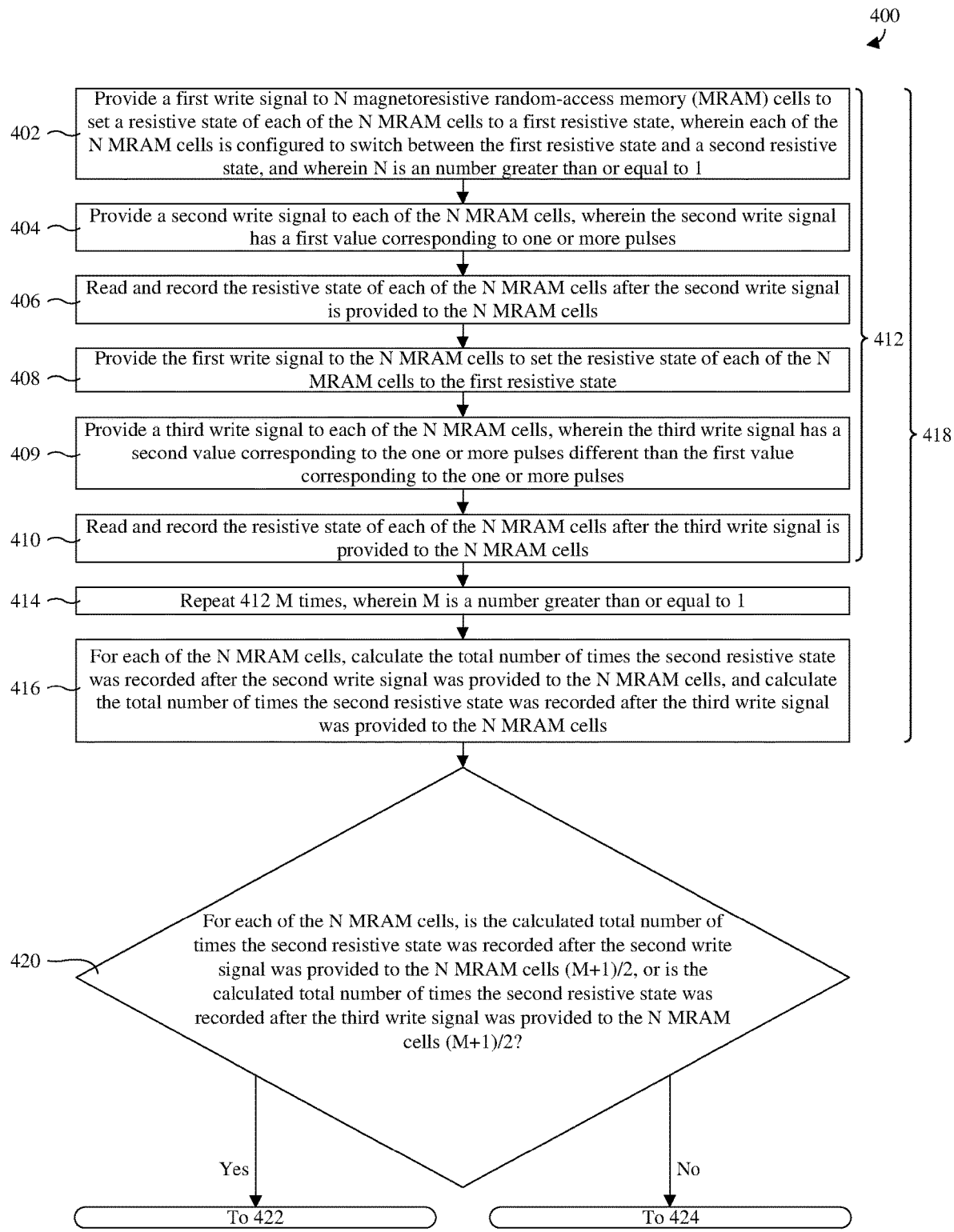
FIGS. 4A-4B illustrate a flowchart of some embodiments of a method for generating an N-bit random number, where N is a number greater than or equal to 1, with the IC of FIG. 2.
Figure 4B:
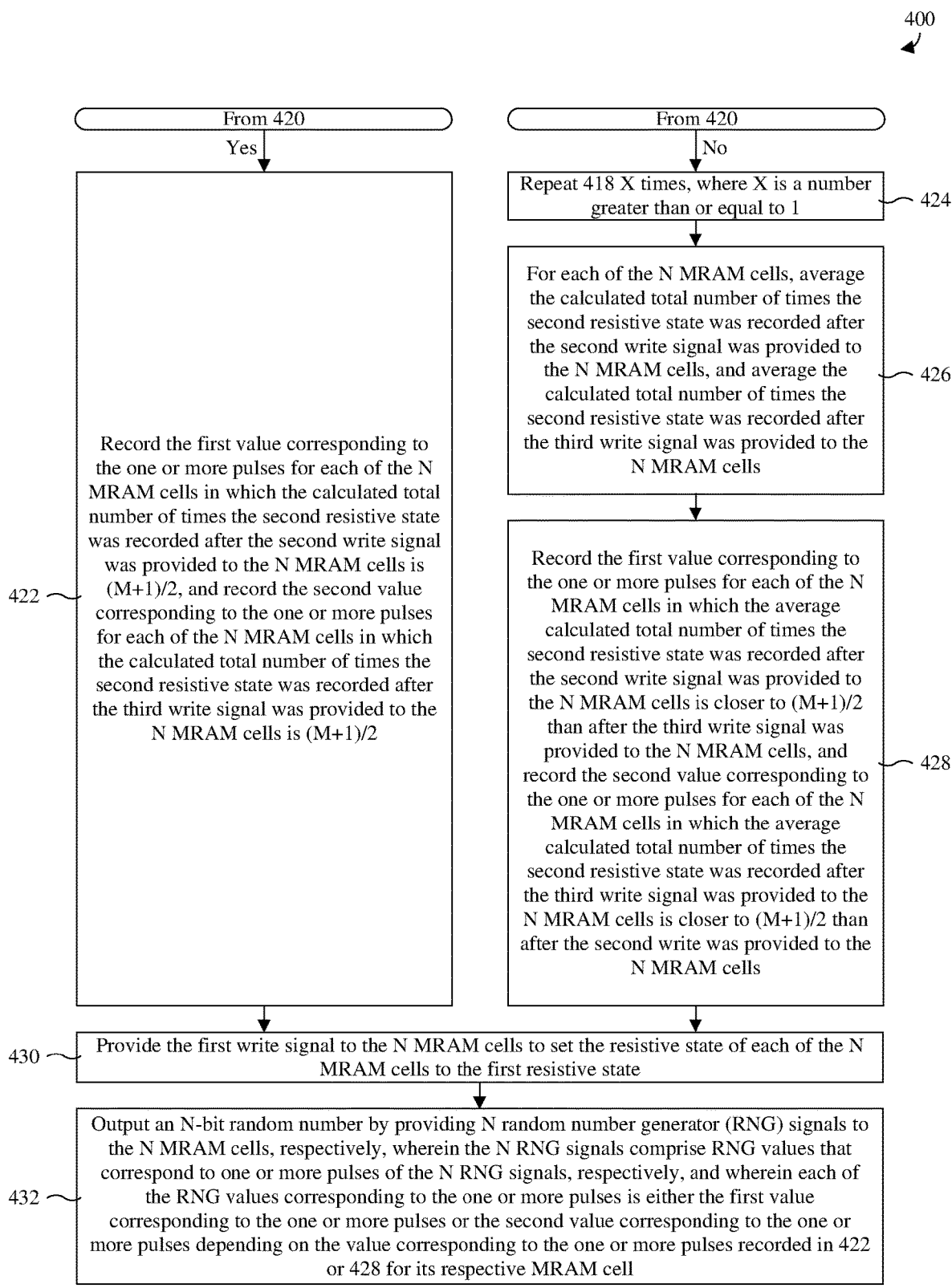

As illustrated in FIGS. 4A-4B, a flowchart 400 of some embodiments of a method for generating an N-bit random number, where N is a number greater than or equal to 1, with the IC 200 of FIG. 2 is provided. While the flowchart 400 of FIGS. 4A-4B is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 402, a first write signal is provided to N magnetoresistive random-access memory (MRAM) cells to set a resistive state of each of the N MRAM cells to the first resistive state, where each of the N MRAM cells is configured to switch between the first resistive state and a second resistive state, and where N is a number greater than or equal to 1. For example, with reference to FIG. 2, the first write signal is provided to the MRAM cells 100 to set their resistive states to the first resistive state. In some embodiments, the controller 210 provides the first write signal to each of the MRAM cells 100. In such embodiments, the tester bias circuitry 216 may initiate the controller 210 to provide the first write signal to each of the MRAM cells 100.

At 404, a second write signal is provided to each of the N MRAM cells, where the second write signal has a first value corresponding to one or more pulses. For example, with reference to FIG. 2, the second write signal is provided to each of the MRAM cells 100. In some embodiments, the controller 210 provides the second write signal to each of the MRAM cells 100. In such embodiments, the tester bias circuitry 216 may initiate the controller 210 to provide the second write signal to each of the MRAM cells 100.

In some embodiments, the RNG value corresponding to the one or more pulses is a voltage value. In such an embodiment, the first value corresponding to the one or more pulses may be between about 1 V and 2.5 V. In some embodiments, the RNG value corresponding to the one or more pulses is a time value of pulse width. Pulse width is the transient time in which the second write signal has a predefined amplitude different than a baseline amplitude. In such embodiments, the first value corresponding to the one or more pulses may be between about 10 nanoseconds and about 1 microsecond. In further such embodiments, the predefined amplitude and the baseline amplitude may be a measure of, for example, voltage, current, or the like.

In some embodiments, the RNG value corresponding to the one or more pulses is a number of pulse signals (e.g., write attempts) over a predefined time. In such embodiments, each of the pulse signals may have a same amplitude and a same pulse width. In further such embodiments, the amplitude may be a measure of, for example, voltage, current, or the like. In yet further such embodiments, the first value corresponding to the one or more pulses may be between about 1 pulse signal and about 50 pulse signals. In some embodiments, the RNG value corresponding to the one or more pulses is a current value. In such embodiments, the first value corresponding to the one or more pulses may be between a first current value that is sufficient to induce a magnetic field that passes through each of the N MRAM cells with a magnetic field strength of about 100 oersted (Oe), and a second current value that is sufficient to induce a magnetic field that passes through each of the N MRAM cells with a magnetic field strength of about 4000 Oe. In further such embodiments, the second write signal may be provided to conductive lines (e.g., bit lines, word lines, write lines, etc.) that are disposed near the N MRAM cells, respectively.

At 406, the resistive state of each of the N MRAM cells is read and recorded after the second write signal is provided to the N MRAM cells. For example, with reference to FIG. 2, after the MRAM cells 100 have been provided the second write signal, the resistive state of each of the MRAM cells 100 is read and recorded to determine if the resistive state of each of the MRAM cells is the first resistive state or the second resistive state. In some embodiments, the RNG output circuitry 212 reads the resistive states of the MRAM cells 100, respectively. In further embodiments, the tester analysis circuitry 218 records the resistive states of the MRAM cells 100 read by the RNG output circuitry 212.

At 408, the first write signal is provided to the N MRAM cells to set the resistive state of each of the N MRAM cells to the first resistive state. For example, with reference to FIG. 2, the first write signal is provided to the MRAM cells 100, respectively, to set their resistive states to the first resistive state. In some embodiments, the controller 210 provides the first write signal to each of the MRAM cells 100. In such embodiments, the tester bias circuitry 216 may initiate the controller 210 to provide the first write signal to each of the MRAM cells 100.

At 409, a third write signal is provided to each of the N MRAM cells, where the third write signal has a second value corresponding to the one or more pulses different than the first value corresponding to the one or more pulses. For example, with reference to FIG. 2, the third write signal is provided to each of the MRAM cells 100. In some embodiments, the controller 210 provides the third write signal to each of the MRAM cells 100. In other embodiments, the tester bias circuitry 216 provides the third write signal to each of the MRAM cells 100. In yet other embodiments, the tester bias circuitry 216 initiates the controller 210 to provide the third write signal to each of the MRAM cells 100.

In such embodiments where the RNG value corresponding to the one or more pulses is a voltage value, the second value corresponding to the one or more pulses may be different than the first value corresponding to the one or more pulses by 0.05 V or 0.1 V. In such embodiments where the RNG value corresponding to the one or more pulses is a time value of pulse width, the second value corresponding to the one or more pulses may be different than the first value corresponding to the one or more pulses by 10 nanoseconds or 100 nanoseconds. In such embodiments where the RNG value corresponding to the one or more pulses is a number of pulse signals (e.g., write attempts) over a predefined time, the second value corresponding to the one or more pulses may be different than the first value corresponding to the one or more pulses by about 1 pulse signal, 5 pulse signals, or 10 pulse signals. In such embodiments where the RNG value corresponding to the one or more pulses is a current value, the second value corresponding to the one or more pulses may be different than the first value corresponding to the one or more pulses by a current value that is sufficient to change the magnetic field strength of the magnetic field that passes through the N MRAM cells by 50 Oe or 100 Oe.

At 410, the resistive state of each of the N MRAM cells is read and recorded after the third write signal is provided to the N MRAM cells. For example, with reference to FIG. 2, after the third write signal has been provided to the MRAM cells 100, the resistive state of each of the MRAM cells 100 is read and recorded to determine if the resistive state of each of the MRAM cells 100 is the first resistive state or the second resistive state. In some embodiments, the RNG output circuitry 212 reads the resistive states of the MRAM cells 100, respectively. In further embodiments, the tester analysis circuitry 218 records the resistive states of the MRAM cells 100 read by the RNG output circuitry 212.

In some embodiments, 402, 404, 406, 408, 409, and 410 may be referred to as a probability trimming loop 412. Although FIG. 4A illustrates the probability trimming loop 412 as providing only a second write signal and a third write signal, it will be appreciated that any number of write signals may be provided to the N MRAM cells. Further, in some embodiments, it will be appreciated that if additional write signals are provided to the N MRAM cells, the resistive state of each of the N MRAM cells is set to the first resistive state before each of the additional write signals are provided to the N MRAM cells. Moreover, it will be appreciated that if additional write signals are provided to the N MRAM cells, the resistive states of each of the N MRAM cells is read and recorded after each of the additional write signals are provided to the N MRAM cells. In addition, it will be appreciated that if additional write signals are provided to the N MRAM cells, each of the additional write signals has a value corresponding to the one or more pulses that differs (e.g., by 0.05 V or 0.1 V, 10 nanoseconds or 100 nanoseconds, etc.) from the value corresponding to the one or more pulses of the most preceding write signal that was provided to the N MRAM cells.

At 414, the probability trimming loop 412 is repeated M times, where M is a number greater than or equal to 1. For example, with reference to FIG. 2, the probability trimming loop 412 is repeated on the MRAM cells 100 M times (e.g., 1 time, 2 times, 5 times, 10 times, etc.). In some embodiments, M is dependent on a predefined statistical analysis (e.g., an infinite population sample size calculation, one-tailed statistical hypothesis test, a two-tailed statistical hypothesis test, some other statistical analysis, or a combination of the foregoing). In further embodiments, conditions (e.g., confidence interval, margin of error, sample size, etc.) of the predefined statistical analysis may depend on a desired specification of the IC 200. For example, M may be at least about 97 if a desired specification of the IC 200 is to be that a given RNG signal has a probability of 0.5, with 95 percent confidence and 10 percent margin of error, to switch the resistive state of a given MRAM cell. It will be appreciated that, in some embodiments, M may not depend on the predefined statistical analysis (e.g., M may be a predefined number not based on the predefined statistical analysis).

At 416, for each of the N MRAM cells, the total number of times the second resistive state was recorded after the second write signal was provided to the N MRAM cells is calculated, and the total number of times the second resistive state was recorded after the third write signal was provided to the N MRAM cells is calculated. In some embodiments, 412, 414, and 416 may be referred to as a probability trimming series 418. Although FIG. 4A illustrates the probability trimming series 418 as calculating the total number of times the second resistive state was recorded, it will be appreciated that the probability trimming series may calculate the total number of times the first resistive state was recorded instead.

For example, with reference to FIG. 2, the tester analysis circuitry 218 calculates the number of times the tester analysis circuitry 218 recorded the second resistive state for each of the MRAM cells 100 after the first probability signal was provided to the MRAM cells 100. In addition, the tester analysis circuitry 218 calculates the number of times the tester analysis circuitry 218 recorded the second resistive state for each of the MRAM cells 100 after the second probability signal was provided to the MRAM cells 100. In some embodiments, once the total number of times the second resistive state is recorded for each of the MRAM cells 100 after both the first probability signal and the second probability signal is provided to the MRAM cells 100, the probability trimming series 418 is complete.

At 420, for each of the N MRAM cells, it is determined whether either the calculated total number of times the second resistive state was recorded after the second write signal was provided to the N MRAM cells is $$\frac{M+1}{2}$$

or the calculated total number of times the second resistive state was recorded after the third write signal was provided to the N MRAM cells is $$\frac{M+1}{2}.$$

For example, with reference to FIG. 2, the tester analysis circuitry 218 determines, for each of the MRAM cells 100, whether either the calculated total number of times the tester analysis circuitry 218 recorded the second resistive state after the second write signal was provided to the MRAM cells 100 is $$\frac{M+1}{2},$$

or the calculated total number of times the tester analysis circuitry 218 recorded the second resistive state after the third write signal was provided to the MRAM cells 100 is $$\frac{M+1}{2}.$$

In some embodiments, if the calculated total number of times the second resistive state was recorded after the first write signal (or the second write signal) was provided to the N MRAM cells is within a predefined range, it will be determined that the calculated total number of times the second resistive state was recorded after the first write signal (or the second write signal) was provided to the N MRAM cells is $$\frac{M+1}{2}.$$

On the other hand, in some embodiments, if the calculated total number of times the second resistive state was recorded after the first write signal (or the second write signal) was provided to the N MRAM cells is outside the predefined range, it will be determined that the calculated total number of times the second resistive state was recorded after the first write signal (or the second write signal) was provided to the N MRAM cells is not $$\frac{M+1}{2}.$$

In some embodiments, the predefined range is a range that defines whether the first value corresponding to the one or more pulses or the second value corresponding to the one or more pulses has a probability of about 0.5 to switch the resistive state of a corresponding MRAM cell.

In some embodiments, the predefined range may be within about 10 percent of $$\frac{M+1}{2}$$

(e.g., $$\frac{M+1}{2}$$

plus or minus 10 percent of $$\frac{M+1}{2}\bigg).$$

Stated differently, the predefined range may be between about 0.45 and about 0.55 (e.g., 0.5 plus or minus 10 percent of 0.5) when utilizing a probability in which the first value (or second value) corresponding to the one or more pulses switches the resistive state of the corresponding MRAM cell. In further embodiments, the predefined range may be within 8 percent of $$\frac{M+1}{2}$$

(e.g., $$\frac{M+1}{2}$$

plus or minus 8 percent of $$\frac{M+1}{2}\bigg),$$

within 6 percent of $$\frac{M+1}{2},$$

within 4 percent of $$\frac{M+1}{2},$$

or within 2 percent of $$\frac{M+1}{2}.$$

Stated differently, when utilizing the probability in which the first value (or second value) corresponding to the one or more pulses switches the resistive state of the corresponding MRAM cell, the predefined range may be between 0.46 and 0.54 (e.g., 0.5 plus or minus 8 percent of 0.5), between 0.47 and 0.53, between 0.48 and 0.52, or between 0.49 and 0.51.

At 422, if it is determined that, for each of the N MRAM cells, the calculated total number of times the second resistive state was recorded is $$\frac{M+1}{2}$$

after either the second write signal was provided to the N MRAM cells or after the third write signal was provided to the N MRAM cells, then either the first value corresponding to the one or more pulses is recorded or the second value corresponding to the one or more pulses is recorded for each of the N MRAM cells. The first value corresponding to the one or more pulses is recorded for each of the N MRAM cells in which the calculated total number of times the second resistive state was recorded after the second write signal was provided to the N MRAM cells is $$\frac{M+1}{2}.$$

The second value corresponding to the one or more pulses is recorded for each of the N MRAM cells in which the calculated total number of times the second resistive state was recorded after the third write signal was provided to the N MRAM cells is $$\frac{M+1}{2}.$$

For example, with reference to FIG. 2, the tester analysis circuitry 218 determines, for each of the MRAM cells 100, that either the calculated total number of times the second resistive state was recorded is $$\frac{M+1}{2}$$

after the second write signal was provided to the MRAM cells 100 or after the third write signal was provided to the MRAM cells 100. For each of the MRAM cells 100 that the tester analysis circuitry 218 determines that the second resistive state was recorded is $$\frac{M+1}{2}$$

after the second write signal was provided to the MRAM cells 100, the tester bias circuitry 216 records (e.g., writes) the first value corresponding to the one or more pulses in a corresponding memory component word 206 (e.g., as a data unit). For each of the MRAM cells 100 that the tester analysis circuitry 218 determines that the second resistive state was recorded is $$\frac{M+1}{2}$$

after the third write signal was provided to the MRAM cells 100, the tester bias circuitry 216 records (e.g., writes) the second value corresponding to the one or more pulses in the corresponding memory component word 206.

Because the first value corresponding to the one or more pulses is recorded for each of the N MRAM cells in which the calculated total number of times the second resistive state was recorded after the second write signal was provided to the N MRAM cells is $$\frac{M+1}{2},$$

providing the first value corresponding to the one or more pulses to such MRAM cells has a probability of about 0.5 (e.g., about 50 percent) to switch the resistive state of such MRAM cells from the first resistive state to the second resistive state. Because the second value corresponding to the one or more pulses is recorded for each of the N MRAM cells in which the calculated total number of times the second resistive state was recorded after the third write signal was provided to the N MRAM cells is $$\frac{M+1}{2},$$

providing the second value corresponding to the one or more pulses to such MRAM cells has a probability of about 0.5 (e.g., about 50 percent) to switch the resistive state of such MRAM cells from the first resistive state to the second resistive state.

Further, in some embodiments, for one or more of the N MRAM cells, the calculated total number of times the second resistive state was recorded may be $$\frac{M+1}{2}$$

after both the second write signal was provided to the N MRAM cells and after the third write signal was provided to the N MRAM cells. In such an embodiment, if the first value corresponding to the one or more pulses is less than the second value corresponding to the one or more pulses, the first value corresponding to the one or more pulses is recorded for such MRAM cells to increase the reliability of such MRAM cells. In further such embodiments, if the second value corresponding to the one or more pulses is less than the first value corresponding to the one or more pulses, the second value corresponding to the one or more pulses is recorded for such MRAM cells to increase the reliability of such MRAM cells.

For example, with reference to FIG. 2, if the tester analysis circuitry 218 determines, for one or more of the MRAM cells 100, the calculated total number of times the second resistive state was recorded is $$\frac{M+1}{2}$$

after both the second write signal was provided to the N MRAM cells and after the third write signal was provided to the N MRAM, the tester analysis circuitry 218 compares the first value corresponding to the one or more pulses to the second value corresponding to the one or more pulses to determine whether the first value corresponding to the one or more pulses is less than the second value corresponding to the one or more pulses, or vice versa. For each of the one or more MRAM cells 100, if the first value corresponding to the one or more pulses is less than the second value corresponding to the one or more pulses, the tester bias circuitry 216 records (e.g., writes) the first value corresponding to the one or more pulses in a corresponding memory component word 206. For each of the one or more MRAM cells 100, if the second value corresponding to the one or more pulses is less than the first value corresponding to the one or more pulses, the tester bias circuitry 216 (e.g., writes) records the second value corresponding to the one or more pulses in a corresponding memory component word 206.

At 424, if it is determined that, for any of the N MRAM cells, the calculated total number of times the second resistive state was recorded is not $$\frac{M+1}{2}$$

after either the second write signal was provided to the N MRAM cells or after the third write signal was provided to the N MRAM cells, the probability trimming series 418 is repeated X times, where X is a number greater than or equal to 1. For example, with reference to FIG. 2, if the tester analysis circuitry 218 determines that the calculated total number of times the second resistive state was recorded is not $$\frac{M+1}{2}$$

for one of the MRAM cells 100 after either the second write signal was provided to the MRAM cells 100 or after the third write signal was provided to the MRAM cells 100, the probability trimming series 418 is repeated X times on the MRAM cells 100. In some embodiments, X is dependent on M, the predefined statistical analysis, and/or a different predefined statistical analysis. In further embodiments, X may be the same as M. In other embodiments, X may be less than or greater than M. It will be appreciated that, in some embodiments, X may not depend on the predefined statistical analysis or M (e.g., X may be a predefined number not based on either the predefined statistical analysis or M).

At 426, for each of the N MRAM cells, the calculated total number of times the second resistive state was recorded after the second write signal was provided to the N MRAM cells is averaged, and the calculated total number of times the second resistive state was recorded after the third write signal was provided to the N MRAM cells is averaged. Although 426 recites the phrase "for each of the N MRAM cells," it will be appreciated that this phrase may instead recite "for each of the MRAM cells of the N MRAM cells that were determined in 420 that the calculated total number of times the second resistive state was recorded is not $$\frac{M+1}{2}$$

after either the second write signal was provided to the N MRAM cells or after the third write signal was provided to the N MRAM cells."

For example, with reference to FIG. 2, if the probability trimming series 418 is repeated one time on the MRAM cells 100, the analysis circuitry calculates an average, for each of the MRAM cells 100, between two calculated total number of times (e.g., a first calculated total number of times when the probability trimming series 418 was performed a first time and a second calculated total number of times when the probability trimming series 418 was repeated the one time)

the second resistive state was recorded after the second write signal was provided to the MRAM cells 100. In addition, the analysis circuitry calculates an average, for each of the MRAM cells 100, between two calculated total number of times (e.g., a third calculated total number of times when the probability trimming series 418 was performed a first time and a fourth calculated total number of times when the probability trimming series 418 was repeated the one time) the second resistive state was recorded after the third write signal was provided to the MRAM cells 100.

At 428, either the first value corresponding to the one or more pulses is recorded or the second value corresponding to the one or more pulses is recorded for each of the N MRAM cells. The first value corresponding to the one or more pulses is recorded for each of the N MRAM cells in which the average of the calculated total number of times the second resistive state was recorded after the second write signal was provided to the N MRAM cells is closer to $$\frac{M+1}{2}$$

than after the third write signal was provided to the N MRAM cells. The second value corresponding to the one or more pulses is recorded for each of the N MRAM cells in which the average of the calculated total number of times the second resistive state was recorded after the third write signal was provided to the N MRAM cells is closer to $$\frac{M+1}{2}$$

than after the second write signal was provided to the N MRAM cells. Although 428 recites the phrase "for each of the N MRAM cells" in FIG. 4B, it will be appreciated that this phrase may instead recite "for each of the MRAM cells of the N MRAM cells that were determined in 420 that the calculated total number of times the second resistive state was recorded is not $$\frac{M+1}{2}$$

after either the second write signal was provided to the N MRAM cells or after the third write signal was provided to the N MRAM cells."

Because the first value corresponding to the one or more pulses is recorded for each of the N MRAM cells in which the average of the calculated total number of times the second resistive state was recorded after the second write signal was provided to the N MRAM cells is closer to $$\frac{M+1}{2}$$

than after the third write signal was provided to the N MRAM cells, providing the first value corresponding to the one or more pulses to such MRAM cells has a probability closer to about 0.5 (e.g., about 50 percent) to switch the resistive state of such MRAM cells from the first resistive state to the second resistive state than the second value corresponding to the one or more pulses. Because the second value corresponding to the one or more pulses is recorded for each of the N MRAM cells in which the average of the calculated total number of times the second resistive state was recorded after the third write signal was provided to the N MRAM cells is closer to $$\frac{M+1}{2}$$

than after the second write signal was provided to the N MRAM cells, providing the second value corresponding to the one or more pulses to such MRAM cells has a probability closer to about 0.5 (e.g., about 50 percent) to switch the resistive state of such MRAM cells from the first resistive state to the second resistive state than the first value corresponding to the one or more pulses.

For example, with reference to FIG. 2, for each of the MRAM cells 100 in which the average of the calculated total number of times the second resistive state was recorded after the second write signal was provided to the MRAM cells 100 is closer to $$\frac{M+1}{2}$$

than after the third write signal was provided to the MRAM cells 100, the tester bias circuitry 216 records (e.g., writes) the first value corresponding to the one or more pulses in a corresponding memory component word 206. For each of the MRAM cells 100 in which the average of the calculated total number of times the second resistive state was recorded after the third write signal was provided to the MRAM cells 100 is closer to $$\frac{M+1}{2}$$

than after the second write signal was provided to the MRAM cells 100, the tester bias circuitry 216 records (e.g., writes) the second value corresponding to the one or more pulses in a corresponding memory component word 206.

Further, in some embodiments, for one or more of the N MRAM cells, the average of the calculated total number of times the second resistive state was recorded after the second write signal was provided to the N MRAM cells may be the same as the average of the calculated total number of times the second resistive state was recorded after the third write signal was provided to the N MRAM cells. In such an embodiment, if the first value corresponding to the one or more pulses is less than the second value corresponding to the one or more pulses, the first value corresponding to the one or more pulses is recorded for such MRAM cells to increase the reliability of such MRAM cells. In further such embodiments, if the second value corresponding to the one or more pulses is less than the first value corresponding to the one or more pulses, the second value corresponding to the one or more pulses is recorded for such MRAM cells to increase the reliability of such MRAM cells.

For example, with reference to FIG. 2, if the tester analysis circuitry 218 determines, for one or more of the MRAM cells 100, the average of the calculated total number of times the second resistive state was recorded after the second write signal was provided to the MRAM cells 100 is the same as the average of the calculated total number of times the second resistive state was recorded after the third write signal was provided to the MRAM cells 100, the tester analysis circuitry 218 compares the first value corresponding to the one or more pulses to the second value corresponding to the one or more pulses to determine whether the first value corresponding to the one or more pulses is less than the second value corresponding to the one or more pulses, or vice versa. If the first value corresponding to the one or more pulses is less than the second value corresponding to the one or more pulses, for each of the one or more MRAM cells 100, the tester bias circuitry 216 records (e.g., writes) the first value corresponding to the one or more pulses in a corresponding memory component word 206. If the second value corresponding to the one or more pulses is less than the first value corresponding to the one or more pulses, for each of the one or more MRAM cells 100, the tester bias circuitry 216 records (e.g., writes) the second value corresponding to the one or more pulses in a corresponding memory component word 206.

At 430, after either the first value corresponding to the one or more pulses or second value corresponding to the one or more pulses is recorded for each of the N MRAM cells, the first write signal is provided to the N MRAM cells to set the resistive state of each of the N MRAM cells to the first resistive state. For example, with reference to FIG. 2, the controller 210 provides the first write signal to the MRAM cells 100 to set their resistive states to the first resistive state.

At 432, an N-bit random number is outputted by providing N random number generator (RNG) signals to the N MRAM cells, respectively. The N RNG signals comprise RNG values that correspond to one or more pulses of the N RNG signals, respectively. Further, each of the RNG values corresponding to the one or more pulses is either the first value corresponding to the one or more pulses or the second value corresponding to the one or more pulses depending on the value corresponding to the one or more pulses recorded in 422 or 428 for its respective MRAM cell.

For example, with reference to FIG. 2, the controller 210 reads the memory component words 206, each of which comprises either the first value corresponding to the one or more pulses or the second value corresponding to the one or more pulses for a corresponding one of the MRAM cells 100. Subsequently, the controller 210 generates RNG signals, each of which corresponds to one of the MRAM cells 100. The RNG signals comprise RNG values that corresponds to the one or more pulses of the N RNG signals, respectively. In some embodiments, for each of the memory component words 206 in which the controller 210 read the first value corresponding to the one or more pulses, the controller generates a corresponding RNG signal comprising a RNG value corresponding to the one or more pulses of the corresponding RNG signal that is the first value corresponding to the one or more pulses. In further embodiments, for each of the memory component words 206 in which the controller 210 read the second value corresponding to the one or more pulses, the controller generates a corresponding RNG signal comprising a RNG value corresponding to the one or more pulses of the corresponding RNG signal that is the second value corresponding to the one or more pulses.

The controller 210 then provides the RNG signals to the MRAM cells 100, respectively. After the controller 210 provides the RNG signals to the MRAM cells 100, the RNG output circuitry 212 reads the resistive states of the MRAM cells 100, respectively. The probability that the RNG output circuitry 212 reads the resistive state of any of the MRAM cells 100 as the second resistive state is about 0.5 (e.g., about 50 percent). This is due to the controller 210 providing each of the MRAM cells 100 in which the first value corresponding to the one or more pulses was stored in its corresponding memory component word 206 a corresponding RNG signal comprising a RNG value corresponding to the one or more pulses that is the first value corresponding to the one or more pulses, and providing each of the MRAM cells 100 in which the second value corresponding to the one or more pulses was stored in its corresponding memory component word 206 a corresponding RNG signal comprising a RNG value corresponding to the one or more pulses that is the second value corresponding to the one or more pulses. Accordingly, the RNG output circuitry 212 may output an N-bit random number based on the RNG output circuitry 212 having a probability of about 0.5 to read the resistive state of each of the MRAM cells 100 as the second resistive state.

As stated above, in some embodiments, the IC 200 comprises the tester circuitry 214. In such embodiments, the tester circuitry 214 may repeat 402-430 at predefined intervals. For example, the tester circuitry 214 may repeat 402-430 each time a random number is to be generated, may repeat 402-430 after a given number of random numbers have been generated, may repeat 402-430 after a given time interval, or the like. In some embodiments, the tester analysis circuitry 218 is configured to read and analyze the resistive states MRAM cells 100 each time 402-430 is repeated, and the tester bias circuitry 216 is configured to write data to the memory component 204 each time 402-430 is repeated. In further embodiments, by repeating 402-430 at the predefined intervals, the tester circuitry 214 may update the RNG values of the RNG signals to account for changes in the MRAM cells from real world usage (e.g., from generating random numbers).

Also stated above, in some embodiments, a semiconductor testing unit may comprise the tester circuitry 214. In such embodiments, the tester circuitry 214 may only perform 402-430 a single time. For example, the semiconductor testing unit may be a fabrication tool located at a fab, and the tester circuitry 214 may perform 402-430 at the fab. In further such embodiments, the tester analysis circuitry 218 may read and analyze the resistive states of the MRAM cells 100 only one time, and the tester bias circuitry 216 may write data to the memory component 204 only one time. It will be appreciated that, in some embodiments, the semiconductor testing unit may comprise a first tester circuitry, and the IC 200 may comprise a second tester circuitry. In such embodiments, the first tester circuitry may perform 402-430 a first time, and the second tester circuitry may perform 402-430 at the predefined intervals after the IC 200 has left the fab.

Figure 5A:
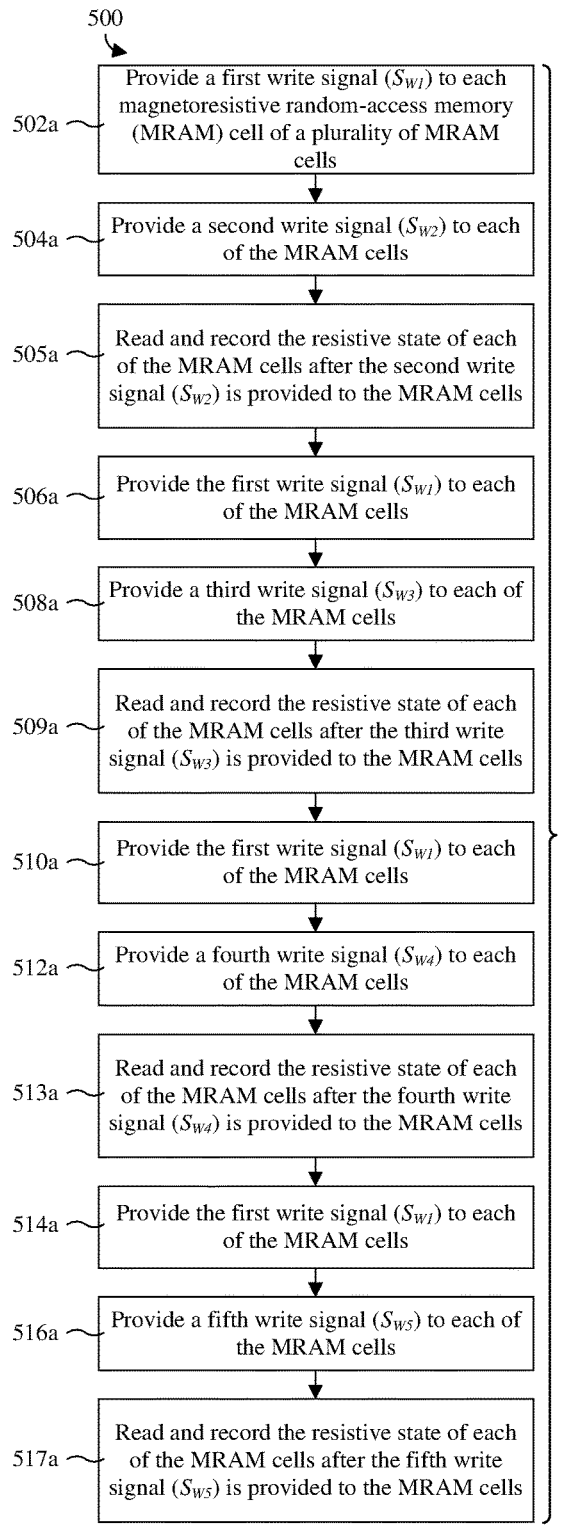
Figure 5A:
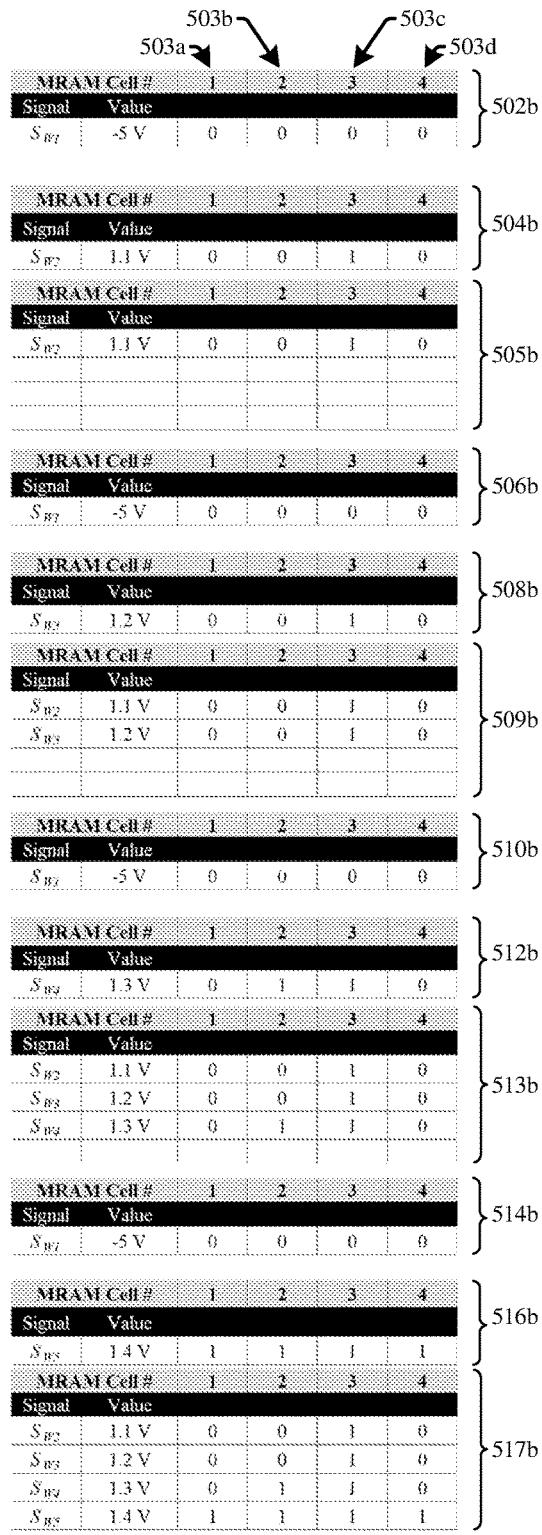

FIGS. 5A-5C illustrate some more detailed embodiments of the probability trimming series 418 of FIGS. 4A-4B being performed on a plurality of magnetoresistive random-access memory (MRAM) cells.

As shown in FIG. 5A, a flowchart 500 illustrates some embodiments of the probability trimming loop 412 of FIGS. 4A-4B. The flowchart 500 illustrates a series of acts 502a-517a that is performed on a plurality of MRAM cells 503a-503d. Corresponding tables 502b-517b illustrate a data state (e.g., binary "0" or binary "1") stored by each of the MRAM cells 503a-503d after the acts 502a-517a are performed on the MRAM cells 503a-503d, respectively. Each of the MRAM cells 503a-503d may respectively store a first data state "0," which indicates a resistive state of the MRAM cell is a first resistive state, or store a second data state "1," which indicates the resistive state of the MRAM cell is a second resistive state.

At 502a, a first write signal $S_{W1}$ is provided to each magnetoresistive random-access memory (MRAM) cell of the plurality of MRAM cells 503a-503d. In some embodiments, the MRAM cells 503a-503d comprise four MRAM cells (e.g., a $1^{st}$ MRAM cell 503a, a $2^{nd}$ MRAM cell 503b, a $3^{rd}$ MRAM cell 503c, and a $4^{th}$ MRAM cell 503d). It will be appreciated, however, that in other examples any number of MRAM cells can be included. As shown in a first table 502b, providing the first write signal $S_{W1}$ to the MRAM cells 503a-503d causes the $1^{st}$ MRAM cell 503a, the $2^{nd}$ MRAM cell 503b, the $3^{rd}$ MRAM cell 503c, and the $4^{th}$ MRAM cell 503d to store the first data state "0."

At 504a, a second write signal $S_{W2}$ is provided to each of the MRAM cells 503a-503d. As shown in a second table 504b, providing the second write signal $S_{W2}$ to the MRAM cells 503a-503d causes the $1^{st}$ MRAM cell 503a, the $2^{nd}$ MRAM cell 503b, and the $4^{th}$ MRAM cell 503d to store the first data state "0." On the other hand, providing the second write signal $S_{W2}$ to the MRAM cells 503a-503d causes the $3^{rd}$ MRAM cell 503c to store the second data state "1."

At 505a, after the second write signal $S_{W2}$ is provided to each of the MRAM cells 503a-503d, the resistive state of each of the MRAM cells 503a-503d is read and recorded. The resistive state of each of the MRAM cells 503a-503d is read by reading the data state stored by each of the MRAM cells 503a-503d because the first data state "0" indicates the first resistive state and the second data state "1" indicates the second resistive state. As shown in a third table 505b, the first resistive state is recorded for the $1^{st}$ MRAM cell 503a, the $2^{nd}$ MRAM cell 503b, and the $4^{th}$ MRAM cell 503d, and the second resistive state is recorded for the $3^{rd}$ MRAM cell 503c.

At 506a, the first write signal $S_{W1}$ is provided to each of the MRAM cells 503a-503d. As shown in a fourth table 506b, providing the first write signal $S_{W3}$ to the MRAM cells 503a-503d causes the $1^{st}$ MRAM cell 503a, the $2^{nd}$ MRAM cell 503b, the $3^{rd}$ MRAM cell 503c, and the $4^{th}$ MRAM cell 503d to store the first data state "0."

At 508a, a third write signal $S_{W3}$ is provided to each of the MRAM cells 503a-503d. As shown in a fifth table 508b, providing the third write signal $S_{W3}$ to the MRAM cells 503a-503d causes the $1^{st}$ MRAM cell 503a, the $2^{nd}$ MRAM cell 503b, and the $4^{th}$ MRAM cell 503d to store the first data state "0." On the other hand, providing the third write signal $S_{W3}$ to the MRAM cells 503a-503d causes the $3^{rd}$ MRAM cell 503c to store the second data state "1."

At 509a, after the third write signal $S_{W3}$ is provided to each of the MRAM cells 503a-503d, the resistive state of each of the MRAM cells 503a-503d is read and recorded. As shown in a sixth table 509b, the first resistive state is recorded for the $1^{st}$ MRAM cell 503a, the $2^{nd}$ MRAM cell 503b, and the $4^{th}$ MRAM cell 503d, and the second resistive state is recorded for the $3^{rd}$ MRAM cell 503c.

At 510a, the first write signal $S_{W1}$ is provided to each of the MRAM cells 503a-503d. As shown in a seventh table 510b, providing the first write signal $S_{W1}$ to the MRAM cells 503a-503d causes the $1^{st}$ MRAM cell 503a, the $2^{nd}$ MRAM cell 503b, the $3^{rd}$ MRAM cell 503c, and the $4^{th}$ MRAM cell 503d to store the first data state "0."

At 512a, a fourth write signal $S_{W4}$ is provided to each of the MRAM cells 503a-503d. As shown in an eighth table 512b, providing the fourth write signal $S_{W4}$ to the MRAM cells 503a-503d causes the $1^{st}$ MRAM cell 503a and the $4^{th}$ MRAM cell 503d to store the first data state "0." On the other hand, providing the fourth write signal $S_{W4}$ to the MRAM cells 503a-503d causes the $2^{nd}$ MRAM cell 503b and the $3^{rd}$ MRAM cell 503c to store the second data state "1."

At 513a, after the fourth write signal $S_{W4}$ is provided to each of the MRAM cells 503a-503d, the resistive state of each of the MRAM cells 503a-503d is read and recorded. As shown in a ninth table 513b, the first resistive state is recorded for the $1^{st}$ MRAM cell 503a and the $4^{th}$ MRAM cell 503d, and the second resistive state is recorded for the $2^{nd}$ MRAM cell 503b and the $3^{rd}$ MRAM cell 503c.

At 514a, the first write signal $S_{W1}$ is provided to each of the MRAM cells 503a-503d. As shown in a tenth table 514b, the first write signal $S_{W1}$ to the MRAM cells 503a-503d causes the $1^{st}$ MRAM cell 503a, the $2^{nd}$ MRAM cell 503b, the $3^{rd}$ MRAM cell 503c, and the $4^{th}$ MRAM cell 503d to store the first data state "0."

At 516a, a fifth write signal $S_{W1}$ is provided to each of the MRAM cells 503a-503d. As shown in an eleventh table 516b, providing the fifth write signal $S_{W1}$ to the MRAM cells 503a-503d causes the $1^{st}$ MRAM cell 503a, the $2^{nd}$ MRAM cell 503b, the $3^{rd}$ MRAM cell 503c, and the $4^{th}$ MRAM cell 503d to store the second data state "1."

At 517a, after the fifth write signal $S_{W5}$ is provided to each of the MRAM cells 503a-503d, the resistive state of each of the MRAM cells 503a-503d is read and recorded. As shown in a twelfth table 517b, the second resistive state is recorded for the $1^{st}$ MRAM cell 503a, the $2^{nd}$ MRAM cell 503b, the $3^{rd}$ MRAM cell 503c, and the $4^{th}$ MRAM cell 503d.

As shown in FIG. 5B, the probability trimming loop 412 is repeated (see, e.g., FIG. 4A-414) nine times (e.g., M=9). FIG. 5B illustrates that after each time the probability trimming loop 412 is repeated, the resistive state of each of the MRAM cells 503a-503d is read and recorded after the second write signal $S_{W2}$, the third write signal $S_{W3}$, the fourth write signal $S_{W4}$, and the fifth write signal $S_{W5}$ are provided to the MRAM cells 503a-503d, respectively. For example, FIG. 5B illustrates a thirteenth table 518 and a fourteenth table 520 that illustrate the resistive states recorded for each of the MRAM cells 503a-503d after the probability trimming loop 412 was repeated the first time (e.g., M=1) and after the probability trimming loop 412 was repeated the ninth time (e.g., M=9), respectively.

As shown in FIG. 5C, for each of the MRAM cells 503a-503d, the total number of times the second data state "1" was recorded after the second write signal $S_{W2}$, the third write signal $S_{W3}$, the fourth write signal $S_{W4}$, and the fifth write signal $S_{W5}$ were provided to the MRAM cells 503a-503d are calculated (see, e.g., FIG. 4A-416). For example, a fifteenth table 522 illustrates that, after the probability trimming loop 412 was repeated nine times, the total number of times the second write signal $S_{W2}$ caused the $1^{st}$ MRAM cell 503a to store the second data state "1" was 4 times; the total number of times the third write signal $S_{W3}$ caused the $1^{st}$ MRAM cell 503a to store the second data state "1" was 5 times; the total number of times the fourth write signal $S_{W4}$ caused the $1^{st}$ MRAM cell 503a to store the second data state "1" was 6 times; and the total number of times the fifth write signal $S_{W5}$ caused the $1^{st}$ MRAM cell 503a to store the second data state "1" was 7 times.

Also shown in FIG. 5C, the calculated total number of times the third write signal $S_{W3}$ caused the first MRAM cell 503a to store the second data state "1" is $$\frac{M+1}{2}$$

(illustrated by a box having thick borders in FIG. 5C). Because the calculated total number of times the third write signal $S_{W3}$ caused the first MRAM cell 503a to store the second data state "1" is $$\frac{M+1}{2},$$

the third write signal $S_{W3}$ has a probability of about 0.5 to cause the first MRAM cell 503a to switch from storing the first data state "0" to storing the second data state "1." Thus, the value corresponding to one or more pulses of the third write signal $S_{W3}$ (e.g., 1.2 Volts (V)) is recorded for the first MRAM cell 503a (see, e.g., FIG. 4B-422). Further, based on similar reasoning, the value corresponding to one or more pulses of the fifth write signal $S_{W5}$ (e.g., 1.4 V) is recorded for the second MRAM cell 503b, the value corresponding to one or more pulses of the fourth write signal $S_{W4}$ (e.g., 1.3 V) is recorded for the third MRAM cell 503c, and the value corresponding to the one or more pulses of the third write signal $S_{W3}$ (e.g., 1.2 V) is recorded for the fourth MRAM cell 503d.

In some embodiments, after the values corresponding to the one or more pulses of the write signals (e.g., $S_{W2}$-$S_{W5}$) are recorded for each of the MRAM cells 503a-503d, the first write signal $S_{W1}$ is provided to each of the MRAM cells 503a-503d, such that each of the MRAM cells 503a-503d are storing the first data state "0" (see, e.g., FIG. 4B-430). Subsequently, RNG signals (see, e.g., FIG. 2-$S_1$-$S_N$) are provided to the MRAM cells 503a-503d, respectively, to output a 4-bit random number (see, e.g., FIG. 4B-432). Each of the RNG signals corresponds to one of the MRAM cells 503a-503d. Further, each of the RNG signals comprises an RNG value that corresponds to one or more pulses and has a probability of about 0.5 to switch the data state of its corresponding MRAM cell 503a-503d from the first data state "0" to the second data state "1." For example, the RNG value corresponding to the one or more pulses of the RNG signal that is provided to the first MRAM cell 503a is the value corresponding to the one or more pulses of the third write signal $S_{W3}$ (e.g., 1.2 V), the RNG value corresponding to the one or more pulses of the RNG signal that is provided to the second MRAM cell 503b is the value corresponding to the one or more pulses of the fifth write signal $S_{W5}$ (e.g., 1.4 V), the RNG value corresponding to the one or more pulse of the RNG signal that is provided to the third MRAM cell 503c is the value corresponding to the one or more pulses of the fourth write signal $S_{W4}$ (e.g., 1.3 V), and the RNG value corresponding to the one or more pulses of the RNG signal that is provided to the fourth MRAM cell 503d is the value corresponding to the one or more pulses of the third write signal $S_{W3}$ (e.g., 1.2 V).

Accordingly, in some embodiments, after the RNG signals are provided to the MRAM cells 503a-503d, respectively, the 4-bit random number is output by reading the data states of the MRAM cells 503a-503d. For example, because the RNG value corresponding to the one or more pulses of each of the RNG signals has a probability of about 0.5 to switch the data state of its corresponding MRAM cell 503a-503d from the first data state "0" to the second data state "1," the probability of reading the second data state "1" (or the first data state "0") for the first MRAM cell 503a, the second MRAM cell 503b, the third MRAM cell 503c, or the fourth MRAM cell 503d is about 0.5. Because the probability of reading the second data state "1" (or the first data state "0") for each of the MRAM cells 503a-503d is about 0.5, the 4-bit random number may be output by reading the data states of the MRAM cells 503a-503d.

In some embodiments, the present application provides a method for generating a random bit. The method includes generating a first random bit by providing a random number generator (RNG) signal to a magnetoresistive random-access memory (MRAM) cell a first time, where the RNG signal has a probability of about 0.5 to switch a resistive state of the MRAM cell from a first resistive state corresponding to a first data state to a second resistive state corresponding to a second data state. The first random bit is read from the MRAM cell.

In other embodiments, the present application provides an integrated chip (IC). The IC includes a random number generator (RNG) comprising N magnetoresistive random-access memory (MRAM) cells, where N is a number greater than or equal to 1. One of the N MRAM cells is configured to switch between a first resistive state and a second resistive state. The IC also includes a memory component configured to store N RNG values, where one of the N RNG values has a probability of about 0.5 to switch a resistive state of the one of the N MRAM cells from the first resistive state to the second resistive state. A controller is coupled to each of the N MRAM cells and the memory component. The controller is configured to read the N RNG values and generate N RNG signals, respectively, where one of the N RNG signals comprises the one of the N RNG values. Further, the controller is configured to provide the N RNG signals to the N MRAM cells, respectively, where the one of the N RNG signals is provided to the one of the N MRAM cells. RNG output circuitry is coupled to the N MRAM cells, where the RNG output circuitry is configured to read the resistive state of each of the N MRAM cells and output an N-bit random number based on the read resistive states of the N MRAM cells.

In yet other embodiments, the present application provides a method for generating an N-bit random number. The method includes setting a resistive state of each of the N magnetoresistive random-access memory (MRAM) cells to a first resistive state, where each of the N MRAM cells is configured to switch between the first resistive state and a second resistive state, and where N is a number greater than or equal to 1. An N-bit random number is generated by providing N random number generator (RNG) signals to the N MRAM cells, respectively, where each of the N RNG signals comprises a RNG value that has a probability of about 0.5 to switch the resistive state of each one of the N RNG signals respective MRAM cell from the first resistive state to the second resistive state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for generating a random bit, the method comprising:
   generating a random bit by providing a random number generator (RNG) signal to a magnetoresistive random-access memory (MRAM) cell, wherein the RNG signal has a RNG value of a write parameter, which results in the MRAM cell switching from a first resistive state to a second resistive state with a probability of about 0.5; and
   determining the RNG value, comprising:
      repeatedly providing a first write signal having a first write value of the write parameter to the MRAM cell;
      repeatedly providing a second write signal having a second write value of the write parameter to the MRAM cell, wherein the second write value is different than the first write value;
      determining the RNG value to be the first write value in response to the first write signal switching the MRAM cell from the first resistive state to the second resistive state with the probability of about 0.5; and
      determining the RNG value to be the second write value in response to the second write signal switching the MRAM cell from the first resistive state to the second resistive state with the probability of about 0.5.

2. The method according to claim 1, wherein the write parameter is voltage.

3. The method according to claim 1, wherein the write parameter is pulse width.

4. The method according to claim 1, wherein the write parameter is a total number of pulses, and wherein the first and second write signals have a same voltage and further have a same pulse width.

5. The method according to claim 1, wherein the first and second write signals are alternatingly provided to the MRAM cell during the repeated providing of the first and second write signals.

6. The method according to claim 1, further comprising:
   counting a number of times the first write signal switched the MRAM cell from the first resistive state to the second resistive state during the repeated providing of the first write signal; and
   determining a probability of the first write signal switching the MRAM cell from the first resistive state to the second resistive state based on the number of times.

7. The method according to claim 1, further comprising:
   repeatedly providing a third write signal having a third write value of the write parameter to the MRAM cell, wherein the third write value is different than the first write value and the second write value; and
   determining the RNG value to be the third write value in response to the third write signal switching the MRAM cell from the first resistive state to the second resistive state with the probability of about 0.5.

8. A method for generating a random bit, the method comprising:
   repeatedly performing a loop, the loop comprising sequentially applying multiple write signals to a memory cell, wherein the multiple write signals share a write parameter affecting a probability of the memory cell switching from a first data state to a second data state, and wherein each of the multiple write signals has a value of the write parameter that is different than the value of the write parameter of each other write signal;
   determining a write signal amongst the multiple write signals that results in the probability being about 50 percent;
   applying the determined write signal to the memory cell to generate a random bit; and
   reading the random bit from the memory cell.

9. The method according to claim 8, wherein the loop comprises resetting the memory cell to the first data state before each of the multiple write signals is applied to the memory cell.

10. The method according to claim 8, wherein the memory cell comprises a magnetic tunnel junction (MTJ).

11. The method according to claim 8, wherein the multiple write signals share a set of one or more pulses, and wherein the write parameter is voltage or pulse width.

12. The method according to claim 8, wherein the multiple write signals are sequentially applied to the memory cell according to a sequence, wherein the write signal and another write signal amongst the multiple write signals result in a same probability of the memory cell switching from the first data state to the second data state, and wherein the write signal is earlier in the sequence than the other memory cell.

13. The method according to claim 12, wherein each of the multiple write signals has a greater value of the write parameter than an immediately preceding write signal in the sequence.

14. A method for generating a random bit, the method comprising:
   providing a plurality of write signals sharing a write parameter affecting a probability of a memory cell switching from a first data state to a second data state;
   performing a plurality of loops, each loop repeatedly writing to the memory cell using the plurality of write signals;
   during the performing of the plurality of loops, counting a number of times that the memory cell switched from the first data state to the second data state for each of the plurality of write signals; and
   determining a write signal amongst the plurality of write signals that has a probability of about 50% of switching the memory cell from the first data state to the second data state, wherein the determining is based on the counts.

15. The method according to claim 14, wherein the plurality of write signals are ordered in a sequence, and wherein each of the plurality of loops writes to the memory cell using the plurality of write signals in an order of the sequence.

16. The method according to claim 15, wherein each of the plurality of write signals has a greater value of the write parameter than an immediately preceding write signal in the sequence.

17. The method according to claim 14, wherein the write parameter is magnetic field, and wherein the write signals are applied directly to a magnetic field generator external to and spaced from the memory cell during the performing of the plurality of loops.

18. The method according to claim 14, wherein the plurality of write signals are applied directly to the memory cell during the performing of the plurality of loops.

19. The method according to claim 14, wherein each of the plurality of loops writes to the memory cell for each of the plurality of write signals.

20. The method according to claim 14, wherein the memory cell is a magnetoresistive random-access memory (MRAM) cell.

\* \* \* \* \*